(12) United States Patent
Cowley et al.

(10) Patent No.: US 7,672,653 B2
(45) Date of Patent: Mar. 2, 2010

(54) REMOVING INTERFERING SIGNALS IN A BROADBAND RADIO FREQUENCY RECEIVER

(75) Inventors: Nick Cowley, Wiltshire (GB); Sawyer Albert David, Wiltshire (GB); Mark Mudd, Wiltshire (GB); Richard Goldman, Somerford Keynes (GB); Colin Perry, Swindon (GB); Ruiyan Zhao, Swindon (GB)

(73) Assignee: Intel Corporation, Santa Clara, CA (US)

( * ) Notice: Subject to any disclaimer, the term of this patent is extended or adjusted under 35 U.S.C. 154(b) by 506 days.

(21) Appl. No.: 11/688,522

(22) Filed: Mar. 20, 2007

(65) Prior Publication Data

US 2008/0231759 A1    Sep. 25, 2008

(51) Int. Cl.
*H04B 1/06* (2006.01)
*H04B 1/18* (2006.01)

(52) U.S. Cl. ............... 455/188.1; 455/334; 455/339

(58) Field of Classification Search ............ 455/188.1, 455/339, 340, 307, 313, 334, 302, 278.1, 455/296; 327/553, 557, 556; 334/14, 18; 348/725, 731
See application file for complete search history.

(56) References Cited

U.S. PATENT DOCUMENTS

| 4,736,457 | A  | * | 4/1988 | Kupfer ................... 455/188.1 |
| 5,652,599 | A  | * | 7/1997 | Pitta et al. .................. 343/858 |
| 6,714,776 | B1 | * | 3/2004 | Birleson .................... 455/302 |
| 6,912,406 | B2 | * | 6/2005 | Lahlum et al. ........... 455/553.1 |
| 7,081,788 | B2 | * | 7/2006 | Hagari ........................ 327/553 |
| 7,209,726 | B2 | * | 4/2007 | Kwong et al. .............. 455/334 |

* cited by examiner

*Primary Examiner*—Sonny Trinh
(74) *Attorney, Agent, or Firm*—Kacvinsky LLC

(57) ABSTRACT

Various embodiments are directed to removing interfering signals in a broadband radio frequency (RF) receiver by implementing a silicon tuner arranged to replicate high quality factor (Q) performance without the advantages of using high Q components available for module tuners. In one or more embodiments, tuned filter elements within a broadband silicon tuner are reused to maximize the attenuation of unwanted signals while minimizing induced undesirable channel ripple. In various implementations, a number of tuned passive inductor/capacitor filter elements are combined as required such that filter elements for an unused frequency band are reconfigured to provide attenuation of and enhanced immunity to unwanted signals. Other embodiments are described and claimed.

17 Claims, 2 Drawing Sheets

REMOVING INTERFERING SIGNALS IN A BROADBAND RADIO FREQUENCY RECEIVER

BACKGROUND

A broadband radio frequency (RF) receiver may include a television tuner arranged to receive an RF television signal through an antenna or cable connection. The television tuner may implement multiple filters to attenuate signals which are outside of a frequency range of a desired frequency band or channel and to remove unwanted signals such as near adjacent interferers, far out interferers, harmonically related interferes, and so forth. In general, the filters attempt to remove the interfering signals before reaching active circuitry so as to effectively eliminate possible inter-modulation or blocking.

Conventional single conversion tuners may incorporate three or more tuned filter elements centered on a desired channel. Such filters may be configured as a first single tuned bandpass element and a second double tuned loosely coupled high quality factor (Q) bandpass arrangement. These filters typically are tuned by application of a varactor diode having a reverse bias capacitance inversely proportional to the applied voltage. In some cases, a television tuner may replicate such filters in three separate bands in order to cover a wide tuning range. In broadband tuners, for example, it is not physically possible to cover the 50 to 860 MHz tuning range in a single filter arrangement due to the large number of octaves tuned and the practical capacitance range available in commercial varactor diodes.

A module tuner may employ three cascaded tuned elements tuned to approximately the same frequency to provide a high Q response. Module tuners may comprise numerous discrete components including tuned filter elements fabricated from inductors (e.g., heavy gauge air coils) and low resistance varactor diodes. Such tuned filter elements are of high Q and provide a very high degree of attenuation to unwanted signals coupled with a minimum induced desired channel ripple. These filtering elements are physically aligned in production (e.g., adjusting wound inductive elements) to maximize performance, where performance is a balance between passband flatness, transition rate from passband to stopband and stopband attenuation.

When implementing a tuner in silicon, however, high Q inductors and varactor diodes are unavailable due to the number and value of components involved. In contrast to module tuners, for example, silicon tuners typically implement either a very simple tracking filter arrangement using a low Q single filter element or a phased feedback arrangement, whereby the feedback is arranged to provide a bandpass characteristic.

FIG. 1 illustrates a conventional silicon tuner 100 implementing tracking filters arranged as two parallel resonant LC bandpass elements indicated by L1//C1 and L2//C2. A simple switching mechanism including switches S1, S2 may be used to switch between frequency bands or channels. Each of these arrangements provides a bandpass response, which can be tuned by adjusting the capacitance value of each LC bandpass element to cover part of the RF frequency range. The limited Q of these circuits will limit the attenuation provided to undesired channels.

DETAILED DESCRIPTION

Various embodiments are directed to removing interfering signals in a broadband RF receiver by implementing a silicon tuner arranged to replicate high Q performance without the advantages of using high Q components available for module tuners. In one or more embodiments, tuned filter elements within a broadband silicon tuner are reused to maximize the attenuation of unwanted signals while minimizing induced undesirable channel ripple. In various implementations, a number of tuned passive inductor/capacitor filter elements are combined as required such that filter elements for an unused frequency band are reconfigured to provide attenuation of and enhanced immunity to unwanted signals.

Figure 1:
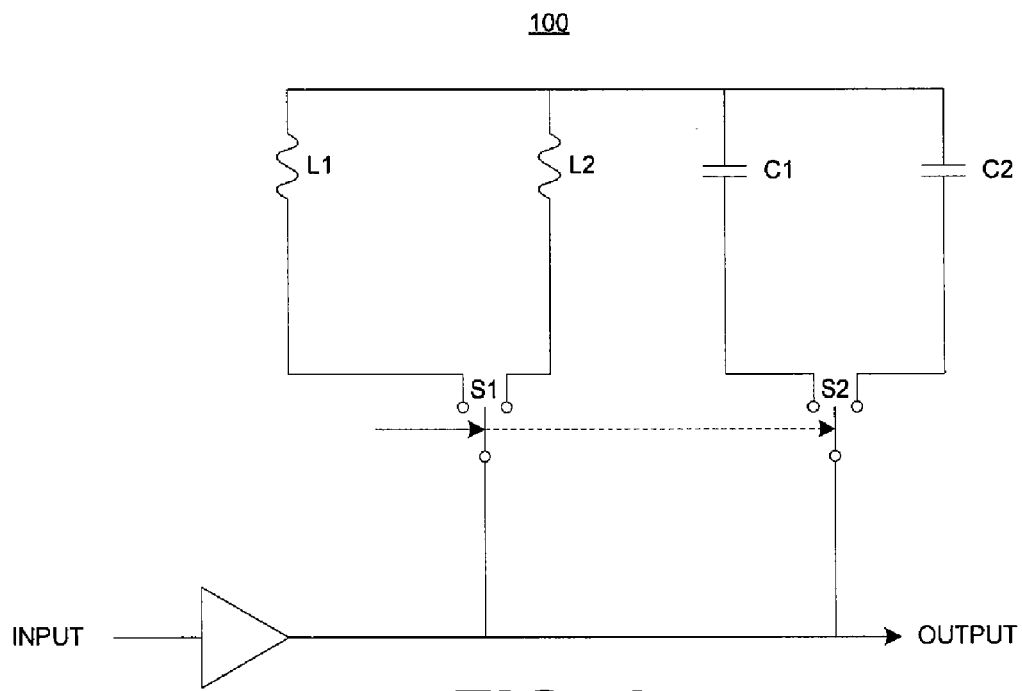
FIG. 1 illustrates a conventional silicon tuner.
Figure 2:
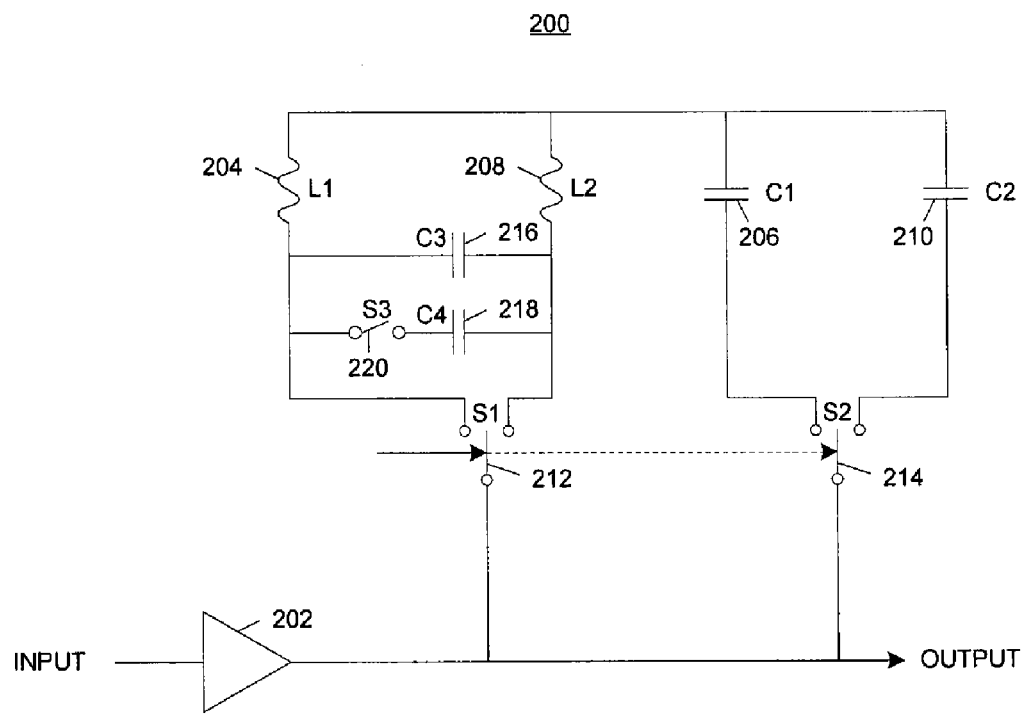
FIG. 2 illustrates a tuner according to one or more embodiments.

FIG. 2 illustrates an exemplary tuner 200 according to one or more embodiments. In general, the tuner 200 may comprise various physical and/or logical components which may be implemented in various ways as desired for a given set of design parameters or performance constraints. Although FIG. 2 may show a limited number of components by way of example, it can be appreciated that a greater or a fewer number of components may be employed for a given implementation.

In one or more embodiments, the tuner 200 may be implemented by an RF receiver as a system or chipset within and/or connected to a device such as a set-top box (STB) device, television (TV) device, digital TV (DTV) device, high-definition TV (HDTV) device, direct broadcast satellite TV (DBS) device, video on-demand (VOD) device, Internet Protocol TV (IPTV) device, Web TV device, digital video recorder (DVR) device, digital versatile disc (DVD) device, high-definition DVD (HD-DVD) device, Blu-ray disc (BD) device, video home system (VHS) device, digital VHS device, entertainment system, media player, media appliance, audio/video (A/V) receiver, personal computer (PC), personal digital assistant (PDA), cellular telephone, smart phone, or any other suitable device which is consistent with the described embodiments.

In various embodiments, the tuner 200 may be implemented within an RF receiver coupled to a media source through various types of communication channels capable of carrying information signals such as wired communication links, wireless communication links, or a combination of both, as desired for a given implementation. The media source generally may comprise various devices and/or systems capable of delivering static or dynamic media content. For example, the media source may comprise or form part of a media distribution system (DS) or broadcast system such as an over-the-air (OTA) broadcast system, DVB system, radio broadcast system, satellite broadcast system, and so forth. The media source may comprise a multimedia server arranged to provide broadcast or streaming media content. The media source may be implemented within an interactive VOD system that allows users to select, receive, and view content over a network. The media source also may comprise or form part of an IPTV system that delivers digital television content over an IP connection, such as a broadband connection. The embodiments are not limited in this context.

The media content delivered to RF receiver may comprise various types of information such as image information, audio information, video information, A/V information, and/or other data. In some implementations, media content may be delivered in various formats for use by a particular device (e.g., STB, TV, DTV device, HDTV device, media player, etc.).

In one or more embodiments, the tuner 200 may be implemented as a broadband silicon tuner configured to cover multiple octaves within a wide frequency range (e.g., 50-860 MHz) and to operate at multiple tuning bands or channels within the frequency range. For example, the silicon tuner 200 may comprise or be implemented as integrated silicon tuner platform for television applications such as ATSC, DTV, HDTV, cable applications, and so forth. While some embodiments may be described for television content and a silicon platform, it can be appreciated that other types of content and platforms may be implemented which are consistent with the described embodiments.

As shown in FIG. 2, the tuner 200 may comprise an amplifier 202 arranged to receive and amplify an input RF signal such as television signal (e.g., ATSC, DTV, HDTV, cable signal). The tuner 200 may include a first bandpass filter comprising a first inductor (L1) 204 and a first capacitor (C1) 206 tuned to a first frequency or tuning band and a second bandpass filter comprising a second inductor (L2) 208 and a second capacitor (C2) 210 tuned to a second frequency band. In various implementations, the first frequency band may be a lower frequency band or lower channel than the second frequency band. In one or more embodiments, the bandpass filters may comprise parallel resonant tracking filters with the center frequency of each of the bandpass filters arranged to track a corresponding desired tuning band or channel.

The tuner 200 may comprise a switching mechanism for selecting a particular tuning band or channel within a frequency range. The switching mechanism may comprise a first switch (S1) 212 and a second switch (S2) 214 implemented by single pole, double throw switches. In one or more embodiments, the switching mechanism may be implemented completely electronically. The switching mechanism may be arranged to switch between a first position (e.g., S1 and S2 both to the left) corresponding to the first frequency band and a second position (e.g., S1 and S2 both to the right) corresponding to the second frequency band. In various implementations, the RF input may be switched to a particular frequency band based on the tuning frequency.

In one or more embodiments, the first bandpass filter comprising the first inductor (L1) 204 and the first capacitor (C1) 206 may be active in the first position and inactive or passive in the second position. The second bandpass filter comprising the second inductor (L2) 208 and the second capacitor 210 may be inactive or passive in the first position and active in the second position. When active, the first bandpass filter comprising the first inductor (L1) 204 and the first capacitor (C1) 206 may implement a parallel resonant circuit (L1//C1) having first bandpass characteristic. When active, the second bandpass filter comprising the second inductor (L2) 208 and the second capacitor 210 may implement a parallel resonant circuit (L2//C2) having a second bandpass characteristic.

When the switching mechanism is in the first position, the tuner 200 may be configured such that the first tuning band (e.g., lower tuning band) is active and the second tuning band (e.g., higher tuning band) is inactive. The first bandpass filter comprising the first inductor (L1) 204 and the first capacitor (C1) 206 may implement a parallel resonant circuit (L1//C1) having first bandpass characteristic for providing a high impedance at a desired channel. For example, at the output of the amplifier 202, the first bandpass filter may implement a parallel tuned load comprising the parallel resistance of the first inductor (L1) 204 and the first capacitor (C1) 206 to present high impedance at the desired channel and decreasing impedance when tuning off of the desired channel. The first bandpass filter may be centered at a particular resonant frequency to pass the desired channel (e.g., first tuning band) and increasingly attenuate undesired channels for larger frequency offsets from the desired channel. The second bandpass filter comprising the second inductor (L2) 208 and the second capacitor 210 may be inactive or passive when the switching mechanism is in the first position.

When the switching mechanism is in the second position, the tuner 200 may be configured such that the second tuning band (e.g., higher tuning band) is active and the first tuning band (e.g., lower tuning band) is inactive. The second bandpass filter comprising the second inductor (L2) 208 and the second capacitor (C2) 210 may implement a second parallel resonant circuit (L2//C2) having a second bandpass characteristic for providing a high impedance at a desired channel. At the output of the amplifier 202, the second bandpass filter may implement a parallel tuned load comprising the parallel resistance of the second inductor (L2) 208 and the second capacitor (C2) 210 to present high impedance at the desired channel and decreasing impedance when tuning off of the desired channel. The second bandpass filter may be centered at a particular resonant frequency to pass the desired channel (e.g., second tuning band) and increasingly attenuate undesired channels for larger frequency offsets from the desired channel. The first bandpass filter comprising the first inductor (L1) 204 and the first capacitor 206 may be inactive or passive when the switching mechanism is in the second position.

In various implementations, the tuner 200 may comprises tuned filter elements that are reused to maximize the attenuation of unwanted signals while minimizing induced undesirable channel ripple. For example, the tuner 200 may comprise one or more combinations of tuned passive inductor/capacitor filter elements such that filter elements for an unused frequency band are reconfigured to provide attenuation of and enhanced immunity to unwanted signals.

In one or more embodiments, the tuner 200 may comprise a third capacitor (C3) 216 and a fourth capacitor (C4) 218 arranged to selectively couple with at least one passive filter element of an inactive bandpass filter for an inactive band so as to provide a notch response which enhances the removal of interfering signals by supplementing the filtering characteristics of an active bandpass filter operating in an active band. For example, when the switching mechanism is in the first position (e.g., S1 and S2 both to the left), the first bandpass filter comprising the first inductor (L1) 204 and the first capacitor (C1) 206 is active, and the first frequency band corresponds to the active frequency band or desired channel. The second bandpass filter comprising the second inductor (L2) and the second capacitor (C2) is inactive, and the second inductor (L2) 208 is a passive filter element of the inactive bandpass filter.

In various implementations, the second inductor (L2) 208 and the third capacitor (C3) 216 may couple to implement a notch response. In the first position, for example, a third switch (S3) 220 is open, and the coupling of the second inductor (L2) 208 and the third capacitor (C3) 216 may implement a notch response or a bandstop to provide an additional notch out of the passband to effectively increase the Q of the first bandpass filter. The notch response may be implemented at a higher frequency or a lower frequency band with respect to the desired channel. In the first position, which may correspond to tuning to a low frequency, the second inductor (L2) 208 and the third capacitor (C3) may implement a notch response to the higher frequency side of the desired channel since, when tuned to a low frequency, there are more distorting channels at higher frequencies.

In the first position, the first bandpass filter may implement a first parallel resonant circuit (L1//C1) having first bandpass characteristic for providing a high impedance at the desired channel and increasing attenuation for larger frequency offsets from the desired channel. When the first parallel resonant circuit (L1//C1) is implemented, the passive second inductor (L2) 208 is reconfigured to provide a coupled notch through the third capacitor (C3) 216 and to implement a first series resonant circuit which supplements the first parallel resonant circuit (L1//C1). The notch implements a series resonance for presenting high impedance off of resonance and low impedance (e.g., short circuit) on resonance. The series resonance effectively superimposes a short circuit for offsets from the desired channel resulting in a far more rapid roll off of unwanted channels around the desired channel.

Similarly, when the switching mechanism is in the second position (e.g., S1 and S2 both to the right), the second bandpass filter comprising the second inductor (L2) 208 and the second capacitor (C2) 210 is active, and the second frequency band corresponds to the active frequency band or desired channel. The first bandpass filter comprising the first inductor (L1) 204 and the first capacitor (C1) 206 is inactive, and the first inductor (L1) 204 is a passive filter element of the inactive bandpass filter.

In various implementations, the first inductor (L1) 204 may couple to the third capacitor (C3) 216 in parallel with the fourth capacitor (C4) 218 to implement a notch response. Coupling through capacitor (C3) 216 in parallel with the fourth capacitor (C4) 218 may be required to provide the appropriate resonant frequency. In the second position, for example, the third switch (S3) 220 is closed, and the coupling of the first inductor (L1) 204, the third capacitor (C3) 216, and the fourth capacitor (C4) 218 may implement a notch response or a bandstop to provide an additional notch out of the passband to effectively increase the Q of the second bandpass filter. The notch response may be implemented at a higher frequency or a lower frequency band with respect to the desired channel. In the second position, which may correspond to tuning to a higher frequency, the first inductor (L1) 204, the third capacitor (C3) 216, and the fourth capacitor (C4) 218 may implement a notch response to the lower frequency side of the desired channel since when tuned to a higher frequency, there are more distorting channels at lower frequencies.

In the second position (e.g., S1 and S2 both to the right), the second bandpass filter may implement a second parallel resonant circuit (L2//C2) having second bandpass characteristic for providing a high impedance at the desired channel and increasing attenuation for larger frequency offsets from the desired channel. When the second parallel resonant circuit (L2//C2) is implemented, the passive first inductor (L1) 204 is reconfigured to provide a coupled notch through the third capacitor (C3) 216 in parallel with the fourth capacitor (C4) 218. In the second position, the first inductor (L1) 204, the third capacitor (C3) 216, and the fourth capacitor (C4) 218 implement a second series resonant circuit which supplements the second parallel resonant circuit (L2//C2). The notch implements a series resonance for presenting high impedance off of resonance and low impedance (e.g., short circuit) on resonance. The series resonance effectively superimposes a short circuit for offsets from the desired channel resulting in a far more rapid roll off of unwanted channels around the desired channel.

Assuming that the left position corresponds to the lower frequency, the first inductor (L1) 204 is larger than the second inductor (L2) 208. In one or more embodiments, first inductor (L1) 204 may be relatively larger by a ratio of 4:1. The first capacitor (C1) 206 is larger than the second capacitor (C2) 210. The third capacitor (C3) 216 may be approximately equal to or smaller than the second capacitor (C2) 210. The fourth capacitor (C4) 218 may be approximately equal to or larger than the first capacitor (C1) 206.

In various embodiments, the capacitors (C1-C4) may be implemented as fixed value capacitors and/or variable value capacitors to provide tracking characteristics. For example, the first capacitor (C1) 206 and the third capacitor (C3) 216 may be implemented as variable capacitors that track with each other when tuning to the frequency. When the first switch (S1) 212 and the second switch (S2) 214 are positioned to the left, the values of the first capacitor (C1) 206 and the third capacitor (C3) 216 may decrease so as to increase the frequency of the passband parallel response and the notch series response.

In various implementations, the described embodiments may be arranged to reuse the inactive band filters to provide an enhancement to the stopband. By reconfiguring non-selected filter elements as a band notch response, which can be applied in series with the bandpass response, bandpass characteristics may be supplemented by the notch response to enhance frequency roll off. Accordingly, a faster transition from passband to stopband and a mean improved stopband performance may be provided while still maintaining a relatively flat passband. The demands of achieving a flat passband and a rapid transition from passband to stopband are mutually exclusive.

In various implementations, the described embodiments offer greater immunity to interfering signals than currently available silicon tuners. Accordingly, superior performance over existing silicon tuners may be provided without moving to the complexity of multiple bandpass filters as deployed in canned or module tuners. Additionally, silicon tuners may be fabricated to achieve a similar performance to module tuners in a cost effective implementation using fewer filter elements. As such, the described embodiments may improve the design/manufacture of silicon tuners for DTV and cable applications by enhancing receiver performance at potentially lower power and/or implementation area.

It should be noted that the described embodiments are not limited to the tuner 200 of FIG. 2. In some implementations, a notch may be applied to enhance the attenuation of unwanted signals when tuned to a given band without adding any additional inductors to the tuner 200. It can be appreciated, however, that the principles of the described embodiments may be implemented with more than two primary parallel resonators and applicable to tuners operating for additional frequency bands by implementing additional capacitors and switches.

Figure 3:
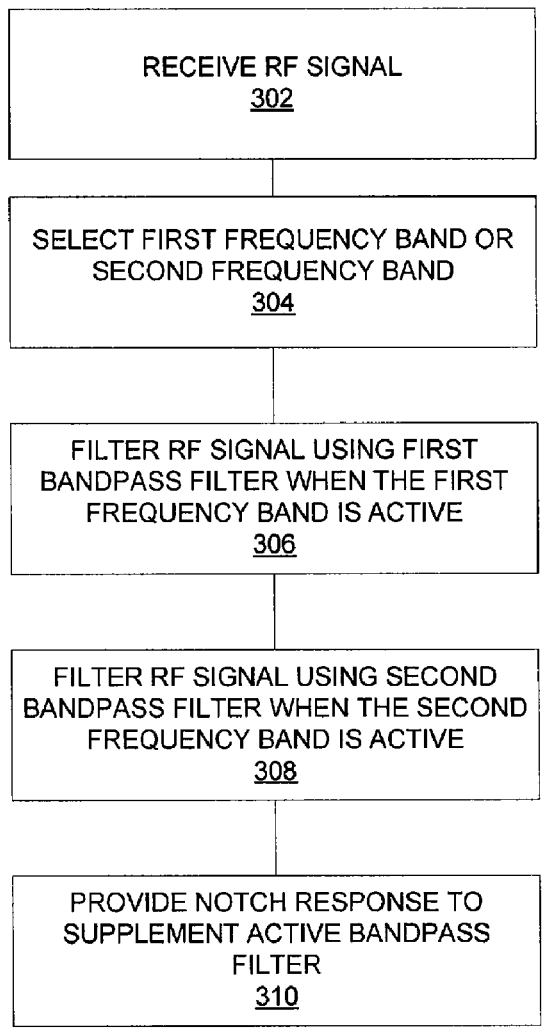
FIG. 3 illustrates a logic flow according to one or more embodiments.

FIG. 3 illustrates a logic flow 300 for removing interfering signals according to one or more embodiments. For purposes of illustration, and not limitation, the description of the logic flow 300 may reference FIG. 2.

The logic flow 300 may comprise receiving an input RF signal at a tuner 200 (block 302), selecting a first frequency band or a second frequency band to be active (block 304), filtering the RF signal using a first bandpass filter when the first frequency band is active (block 306), filtering the RF signal using a second bandpass filter when the second frequency band is active (block 308), and providing a notch response which enhances removal of interfering signals by supplementing filtering characteristics of an active bandpass filter (block 310).

The first bandpass filter may comprise a first inductor (L1) 204 and a first capacitor (C1) 206, the second bandpass filter may comprise a second inductor (L2) 208 and a second capacitor (C2) 210, and the notch response may be provided by selectively coupling a third capacitor (C3) 216 with at least one passive filter element of an inactive bandpass filter for an inactive frequency band. The first frequency band may be lower than the second frequency band. In various implementations, parallel resonant filtering characteristics of the active bandpass filter are supplemented with series resonant filtering characteristics of the passive filter element (e.g., L2) and the third capacitor (C3) 216. In one or more embodiments, the passive filter element may be coupled to the third capacitor (C3) 216 in parallel with a fourth capacitor (C4) 218 to provide a notch response. In such embodiments, the parallel resonant filtering characteristics of the active bandpass filter may be supplemented with series resonant filtering characteristics of the passive filter element (e.g., L1), the third capacitor (C3) 216, and the fourth capacitor (C4) 218.

Figure 4:
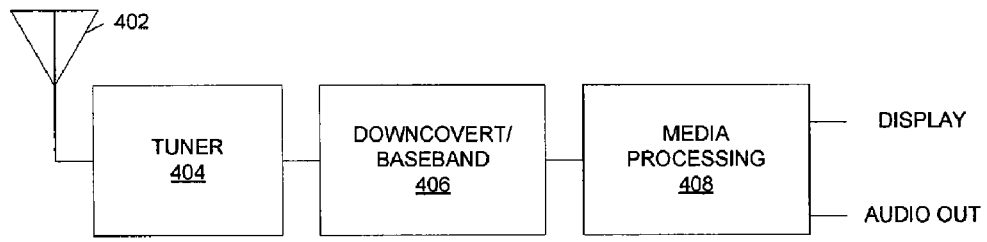
FIG. 4 illustrates a media system according to one or more embodiments.

FIG. 4 illustrates a block diagram of a media system 400 according to one or more embodiments. As shown, the media system 400 may comprise a plurality of functional units or modules for receiving and processing media content. In various embodiments, a functional unit or module may comprise hardware and/or software for performing one or more operations for the media system 400. For example, a module may comprise controller or other computing device arranged to execute logic implemented as software, code, and/or firmware. A module also may comprise memory implemented by one or more types of computer-readable storage media such as volatile or non-volatile memory, removable or non-removable memory, erasable or non-erasable memory, writeable or re-writeable memory, and so forth. Although FIG. 4 may show a limited number of components by way of example, it can be appreciated that a greater or a fewer number of components may be employed for a given implementation.

In various embodiments, the media system 400 may form part of a wired communications system, a wireless communications system, or a combination of both. For example, the media system 400 may be arranged to communicate information over one or more types of wired communication links. Examples of a wired communication link, may include, without limitation, a wire, cable, bus, printed circuit board (PCB), Ethernet connection, peer-to-peer (P2P) connection, backplane, switch fabric, semiconductor material, twisted-pair wire, co-axial cable, fiber optic connection, and so forth. The media system 400 also may be arranged to communicate information over one or more types of wireless communication links. Examples of a wireless communication link may include, without limitation, a radio channel, satellite channel, television channel, broadcast channel infrared channel, radio-frequency (RF) channel, Wireless Fidelity (WiFi) channel, a portion of the RF spectrum, and/or one or more licensed or license-free frequency bands. Although certain embodiments may be illustrated using a particular communications media by way of example, it may be appreciated that the principles and techniques discussed herein may be implemented using various communication media and accompanying technology.

The media system 400 may be arranged to communicate one or more types of information, such as media information and control information. Media information generally may refer to any data representing content meant for a user, such as image information, video information, audio information, audio/video (A/V) information, graphical information, voice information, textual information, numerical information, alphanumeric symbols, character symbols, and so forth. Control information generally may refer to any data representing commands, instructions or control words meant for an automated system. For example, control information may be used to route media information through a system, or instruct a node to process the media information in a certain manner. The media and control information may be communicated from and to a number of different devices or networks. In various implementations, the media information and control information may be segmented into a series of packets. Each packet may comprise, for example, a discrete data set having a fixed or varying size represented in terms of bits or bytes. It can be appreciated that the described embodiments may be applicable to other types of communication content or format, such as packets, frames, fragments, cells, windows, units, and so forth.

The media system 400 may communicate information in accordance with one or more protocols and/or standards as promulgated by a standards organization, such as the International Telecommunications Union (ITU), the International Organization for Standardization (ISO), the International Electrotechnical Commission (IEC), the Institute of Electrical and Electronics Engineers (IEEE), the Internet Engineering Task Force (IETF), and so forth. In various embodiments, for example, the media system 400 may communicate information according to media processing standards such as, for example, the ITU/IEC H.263 standard (Video Coding for Low Bitrate Communication, ITU-T Recommendation H.263v3, published November 2000), the ITU/IEC H.264 standard (Video Coding for Very Low Bit Rate Communication, ITU-T Recommendation H.264, published May 2003), Motion Picture Experts Group (MPEG) standards (e.g., MPEG-1, MPEG-2, MPEG-4), Digital Video Broadcasting (DVB) terrestrial (DVB-T) standards, DVB satellite (DVB-S or -S2) standards, DVB cable (DVB-C) standards, DVB terrestrial for handhelds (DVB-H), National Television System Committee (NTSC) and Phase Alteration by Line (PAL) standards, Advanced Television Systems Committee (ATSC) standards, Society of Motion Picture and Television Engineers (SMPTE) standards such as the SMPTE 421M or VC-1 standard based on Windows Media Video (WMV) version 9, Digital Transmission Content Protection over Internet Protocol (DTCP-IP) standards, High performance radio Local Area Network (HiperLAN) standards, and so forth.

In one or more embodiments, the media system 400 may include a communications antenna 402 comprising one or more internal and/or external antennas coupled to a tuner 404 implemented as described above. In various implementations, the communications antenna 402 may be arranged to receive RF signals over a wireless communication link. Examples of an antenna may include, without limitation, an omni-directional antenna, a monopole antenna, a dipole antenna, an end fed antenna, a circularly polarized antenna, a microstrip antenna, a diversity antenna, a dual antenna, an antenna array, and so forth. Although the communications antenna 402 is shown as a single antenna for purposes of illustration, multiple antennas may be employed for a given implementation.

In one or more embodiments, the tuner 404 may be coupled to a downconvert/baseband module 406. The downconvert/baseband module 406 may be arranged to receive the output from the tuner 404 and to downconvert the RF signal to baseband signals such as in-phase and quadrature (I/Q) signals. In some cases, the downconvert/baseband module 406 may be implemented as an RF integrated circuit (RFIC) chip and may comprise various components including, for example, a mixer, frequency synthesizer, automatic gain control (AGC), and/or other active circuitry.

The media system 400 may comprise a media processing module 408. The media processing module 408 may be arranged to perform various back-end video and/or audio processing operations within the media system 400 for rendering, displaying, and/or playing media content on a display such as a screen or other user interface (UI). In various embodiments, the media processing module 408 may be arranged to perform video and/or audio processing operations for de-interlacing, image enhancement, vertical blanking interval (VBI) processing, teletext, closed captioning, scaling, picture-in-picture (PiP), on screen display (OSD), color control, display interfacing, low voltage differential signaling (LVDS), and so forth.

Numerous specific details have been set forth to provide a thorough understanding of the embodiments. It will be understood, however, that the embodiments may be practiced without these specific details. In other instances, well-known operations, components and circuits have not been described in detail so as not to obscure the embodiments. It can be appreciated that the specific structural and functional details are representative and do not necessarily limit the scope of the embodiments.

Various embodiments may comprise one or more elements. An element may comprise any structure arranged to perform certain operations. Each element may be implemented as hardware, software, or any combination thereof, as desired for a given set of design and/or performance constraints. Although an embodiment may be described with a limited number of elements in a certain topology by way of example, the embodiment may include more or less elements in alternate topologies as desired for a given implementation.

It is worthy to note that any reference to "one embodiment" or "an embodiment" means that a particular feature, structure, or characteristic described in connection with the embodiment is included in at least one embodiment. The appearances of the phrase "in one embodiment" in the specification are not necessarily all referring to the same embodiment.

Although some embodiments may be illustrated and described as comprising exemplary functional components or modules performing various operations, it can be appreciated that such components or modules may be implemented by one or more hardware components, software components, and/or combination thereof. The functional components and/or modules may be implemented, for example, by logic (e.g., instructions, data, and/or code) to be executed by a logic device (e.g., processor). Such logic may be stored internally or externally to a logic device on one or more types of computer-readable storage media.

It also is to be appreciated that the described embodiments illustrate exemplary implementations, and that the functional components and/or modules may be implemented in various other ways which are consistent with the described embodiments. Furthermore, the operations performed by such components or modules may be combined and/or separated for a given implementation and may be performed by a greater number or fewer number of components or modules.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within registers and/or memories into other data similarly represented as physical quantities within the memories, registers or other such information storage, transmission or display devices.

It is worthy to note that some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other. With respect to software elements, for example, the term "coupled" may refer to interfaces, message interfaces, API, exchanging messages, and so forth.

Some of the figures may include a logic flow. It can be appreciated that an illustrated logic flow merely provides one example of how the described functionality may be implemented. Further, a given logic flow does not necessarily have to be executed in the order presented unless otherwise indicated. In addition, a logic flow may be implemented by a hardware element, a software element executed by a processor, or any combination thereof. The embodiments are not limited in this context.

While certain features of the embodiments have been illustrated as described above, many modifications, substitutions, changes and equivalents will now occur to those skilled in the art. It is therefore to be understood that the appended claims are intended to cover all such modifications and changes as fall within the true spirit of the embodiments.

The invention claimed is:

1. A tuner comprising:
 a first bandpass filter tuned to a first frequency band, the first bandpass filter comprising a first inductor and a first capacitor;
 a second bandpass filter tuned to a second frequency band, the second bandpass filter comprising a second inductor and a second capacitor;
 a switching mechanism to select the first frequency band or the second frequency band to be active; and
 a third capacitor to selectively couple with at least one passive filter element of an inactive bandpass filter for an inactive frequency band and provide a notch response which enhances removal of interfering signals by supplementing filtering characteristics of an active bandpass filter operating in an active band.

2. The tuner of claim 1, wherein parallel resonant filtering characteristics of the active bandpass filter are supplemented by series resonant filtering characteristics of the passive filter element and the third capacitor.

3. The tuner of claim 1, further comprising a fourth capacitor arranged to selectively couple with at least one passive filter element of an inactive bandpass filter for an inactive band and provide a notch response.

4. The tuner of claim 3, wherein the passive filter element couples to the third capacitor in parallel with the fourth capacitor.

5. The tuner of claim 3, wherein parallel resonant filtering characteristics of the active bandpass filter are supplemented by series resonant filtering characteristics of the passive filter element, the third capacitor, and the fourth capacitor.

6. The tuner of claim 1, wherein the passive filter element comprises the first inductor or the second inductor.

7. The tuner of claim 1, wherein the first frequency band is lower than the second frequency band.

8. The tuner of claim 1, further comprising one or more additional bandpass filters tuned to one or more additional frequency bands.

9. The tuner of claim 1, further comprising more than two primary parallel resonators.

10. The tuner of claim 1 implemented as a broadband silicon tuner.

11. A media system comprising an antenna coupled to the tuner of claim 1.

12. A method comprising:
receiving an input radio frequency (RF) signal at a tuner;
selecting a first frequency band or a second frequency band to be active;
filtering the RF signal using a first bandpass filter when the first frequency band is active, the first bandpass filter comprising a first inductor and a first capacitor;
filtering the RF signal using a second bandpass filter when the second frequency band is active, the second bandpass filter comprising a second inductor and a second capacitor; and
providing a notch response which enhances removal of interfering signals by supplementing filtering characteristics of an active bandpass filter operating in an active band by selectively coupling a third capacitor with at least one passive filter element of an inactive bandpass filter for an inactive frequency band.

13. The method of claim 12, further comprising supplementing parallel resonant filtering characteristics of the active bandpass filter with series resonant filtering characteristics of the passive filter element and the third capacitor.

14. The method of claim 12, further comprising selectively coupling a fourth capacitor with at least one passive filter element of an inactive bandpass filter for an inactive band to provide a notch response.

15. The method of claim 14, further comprising coupling the passive filter element to the third capacitor in parallel with the fourth capacitor.

16. The method of claim 15, further comprising supplementing parallel resonant filtering characteristics of the active bandpass filter with series resonant filtering characteristics of the passive filter element, the third capacitor, and the fourth capacitor.

17. The method of claim 12, wherein the first frequency band is lower than the second frequency band.

* * * * *